US007189656B2

(12) United States Patent
Sato et al.

(10) Patent No.: US 7,189,656 B2
(45) Date of Patent: Mar. 13, 2007

(54) METHOD FOR MANUFACTURING AG-OXIDE-BASED ELECTRIC CONTACT MATERIAL AND PRODUCT OF THE SAME

(75) Inventors: Sadao Sato, Tokyo (JP); Hideo Kumita, Tokyo (JP); Kohei Tsuda, Tokyo (JP); Mitsuo Yamasita, Kanagawa (JP); Kunio Shiokawa, Kanagawa (JP); Kenichi Kamiura, Kanagawa (JP); Kiyoshi Sekiguchi, Kanagawa (JP)

(73) Assignee: Tokuriki Honten Co. Ltd., Tokyo (JP)

( * ) Notice: Subject to any disclaimer, the term of this patent is extended or adjusted under 35 U.S.C. 154(b) by 200 days.

(21) Appl. No.: 10/503,300

(22) PCT Filed: Aug. 15, 2002

(86) PCT No.: PCT/JP02/08294

§ 371 (c)(1),
(2), (4) Date: Aug. 2, 2004

(87) PCT Pub. No.: WO2004/016818

PCT Pub. Date: Feb. 26, 2004

(65) Prior Publication Data

US 2005/0202610 A1 Sep. 15, 2005

(51) Int. Cl.
*H01L 23/48* (2006.01)

(52) U.S. Cl. ........................ 438/754; 438/85; 438/104; 438/608; 148/431

(58) Field of Classification Search ........ 438/720–722, 438/704, 608; 505/1, 887; 174/125.1; 29/599; 148/431, 527, 678; 252/514
See application file for complete search history.

(56) References Cited

U.S. PATENT DOCUMENTS 3,874,941 A 4/1975 Shibata
3,933,485 A 1/1976 Shibata (Continued)

FOREIGN PATENT DOCUMENTS

EP 0508055 A1 10/1992

(Continued)

OTHER PUBLICATIONS

PCT/JP02/08294 Search Report EPA 02-752779.3 Office Action dated Sep. 9, 2005.

(Continued)

*Primary Examiner*—Dung A. Le
(74) *Attorney, Agent, or Firm*—Levisohn Berger LLP

(57) ABSTRACT

Although an Ag—CdO-based material has excellent electric properties such as deposition resistance, arc resistance and low contact resistance, which are required for an electric contact, the discharge standard provision in Japan, EC Directive on Waste from Electrical and Electronic Equipment (WEEE) and the like have been directed toward disuse of Cd, as already known.

Thus, the present invention is characterized in that after an atmosphere in a pressured oxidation furnace is replaced with oxygen, the temperature of an internal-oxidative Ag alloy prepared under a condition of a cold roll rate of 50 to 95% is gradually raised from a temperature of 200° C. or less in a pressured oxygen atmosphere with an oxygen pressure of 5 to 50 kg/cm$^2$ and internal oxidation processing is performed with an upper limit temperature of 700° C., thereby restraining an Ag-rich layer generated on an outermost surface and an oxide-flocculated layer immediately below the Ag-rich layer and uniformly and finely precipitating and dispersing a composite oxide of added elements to a deep part of an internal structure.

7 Claims, 2 Drawing Sheets

U.S. PATENT DOCUMENTS

| | | | | | |
|---|---|---|---|---|---|
| 5,068,219 | A | * | 11/1991 | Hagino et al. | 505/231 |
| 5,078,810 | A | | 1/1992 | Tanaka et al. | |
| 5,102,480 | A | * | 4/1992 | Tanaka et al. | 148/431 |
| 5,834,374 | A | * | 11/1998 | Cabral, et al. | 438/685 |

FOREIGN PATENT DOCUMENTS

| | | | |
|---|---|---|---|
| EP | 0877403 | A1 | 11/1998 |
| JP | 54-2234 | | 1/1979 |
| JP | 58-100650 | | 6/1983 |
| JP | 59-219432 | | 12/1984 |
| JP | 62-241207 | | 10/1987 |
| JP | 02-173226 | | 7/1990 |
| JP | 9-59727 | | 3/1997 |

OTHER PUBLICATIONS

Chinese Patent Office - Office Action, 02820628.2, Apr. 14, 2006.
Austrian Patent Office Examination Report (4 pages).

* cited by examiner

Fig. 3

| Sample number | | Composition (wt%) | Processing rate (%) | Contact resistance (mΩ) | | Number of deposition | Arc resistance (mg) |
|---|---|---|---|---|---|---|---|
| | | | | Before opening/closing | After $10^4$ opening/closing | 60A, $10^4$ times opening/closing | After $10^3$ opening/closing |
| Conventional examples | 1 | Ag-12Cd | 34 | 0.52 | 0.80 | 10 | 35~51 |
| | 2 | Ag-6Sn-3In | 30 | 0.55 | 0.98 | 2 | 30~46 |
| | 3 | Ag-7In | 35 | 0.48 | 0.77 | 19 | 59~72 |
| Examples of the embodiment | 1 | Ag-1.2Sn-9.8In-0.1Bi-0.2Ni | 87 | 0.53 | 0.71 | 0 | 22~27 |
| | 2 | Ag-5Sn-5In-0.8Bi-0.9Co | 52 | 0.56 | 0.72 | 1 | 23~30 |
| | 3 | Ag-1Sn-10In-0.07Sb-0.3Fe | 70 | 0.55 | 0.70 | 0 | 18~25 |
| | 4 | Ag-3Sn-3.2In-1.9Bi-0.8Ni | 89 | 0.49 | 0.67 | 0 | 21~28 |
| | 5 | Ag-4Sn-3In-1Bi-0.5Ni-0.5Co | 76 | 0.51 | 0.69 | 1 | 27~33 |
| | 6 | Ag-2Sn-7In-0.5Sb-0.1Co | 67 | 0.48 | 0.68 | 0 | 24~30 |
| | 7 | Ag-3Sn-4In-0.3Bi-5Sb-0.05Ni | 63 | 0.56 | 0.70 | 0 | 17~24 |
| | 8 | Ag-5Sn-10In-2Bi-0.8Sb-1Fe | 95 | 0.50 | 0.74 | 0 | 20~26 |
| | 9 | Ag-2Sn-6In-0.05Bi-1Sb-0.1Ni | 73 | 0.48 | 0.68 | 1 | 25~33 |

METHOD FOR MANUFACTURING AG-OXIDE-BASED ELECTRIC CONTACT MATERIAL AND PRODUCT OF THE SAME

This application is a 371 of PCT/JP02/08294 Aug. 15, 2002

TECHNICAL FIELD

This invention relates to an Ag-oxide-based electric contact material having excellent contact reliability, deposition resistance and arc resistance, used for various switches, contactors, breakers and the like, and a method for manufacturing the same.

BACKGROUND ART

Among various electric contact materials that have been used, particularly Ag—CdO-based materials have excellent electric properties such as deposition resistance, arc resistance and low contact resistance and therefore there has been a large demand for Ag—CdO-based materials in various fields. These materials have been improved over a long time and many academic researches on these materials have been conducted. These materials and manufacturing techniques have reached, so to speak, the maximum.

Recently, however, the cadmium (Cd) discharge standard provision in Japan, EC Directive on Waste from Electrical and Electronic Equipment (WEEE) and the like have been directed toward disuse of Cd, as already known.

Under such conditions, a Cd-free contact material having excellent electric properties that can replace Ag—CdO-based electric contact materials have been increasingly demanded.

Thus, an Ag—(Sn, In, Sb) based internal oxidation contact material has been developed as a medium-load contact having various properties. However, recent devices are miniaturized very rapidly and more strict properties, particularly of a contact, are demanded.

As internal oxidation processing is performed to an alloy formed by adding Sn, In, Sb, Bi or the like to Ag, an internal structure having an oxide precipitated and dispersed therein is provided. However, as a result of research on contact manufacturing conditions, internal oxidation conditions, and damage and exhaustion after contact property evaluation test, it is found that an Ag-rich layer formed on the surface at the time of preparing a contact and an oxide-flocculated layer that is immediately below the Ag-rich layer cause adverse effects such as deposition and increase in temperature of the contact at the time of opening/closing of the contact.

Thus, it is an object of the present invention to solve the problem of disuse of Cd, provide properties equivalent to those of an Ag—CdO-based electric contact material, restrain generation of an Ag-rich layer and an oxide-flocculated layer that is immediately below the Ag-rich layer, which are proper to internal oxidation processing of a Cd-free contact material such as an Ag—(Sn, In, Sb)-based material, and solve various problems such as unevenness in distribution of concentration of added element oxide particles, coarsening of the particles, and flocculation of the particles.

DISCLOSURE OF THE INVENTION

In the present invention, the inventor analyzed various elements causing the temperature, oxygen pressure and added element in the internal oxidation mechanism to change the oxidized structure and also reviewed the manufacturing conditions with a broader scope of analysis. Moreover, the inventor reconsidered the contribution of various elements other than Cd to the contact property of the oxide and analyzed various phenomena with respect to a cleaning effect and arc on the surface of an electric contact, for example, properties of an oxide to be added, particularly the temperature characteristic of its steam pressure and the relation between the state of dispersion in Ag and an arc-suppressing phenomenon in an arc generated at the time of opening/closing. Thus, the inventor could confirm the optimum relation of the dispersion in Ag of an oxide containing an added element and composite oxide having electric properties such as deposition resistance, arc resistance and low contact resistance that are equivalent to those of an Ag—CdO-based electric contact material.

On the basis of such confirmation, the inventor paid attention to an Sn oxide and an Sb oxide, which have a higher steam pressure than CdO within a temperature range of approximately 1500 to 4000° C. and are less toxic, and confirmed that these oxides exhibit a contact surface cleaning effect equivalent to or higher than that of a CdO-based material.

Moreover, the inventor also confirmed that dispersion of composite oxides of added elements other than Sn into Ag provides a synergistic effect.

Thus, the present invention is provided on the basis of the, above-described confirmation. The present invention is characterized in that an oxide of In having a low steam pressure than CdO within a temperature range of approximately 500 to 4000° C. is dispersed in an Sn oxide, thereby making the behavior of a synthetic steam pressure of these oxides in the form of a metal composite oxide more approximate to the behavior of the steam pressure of CdO so that their synergistic effect provides excellent contact properties. The present invention is also characterized in that as a measure for restraining generation of an Ag-rich layer on the outermost surface of the contact, which is considered to make the contact reliability of the contact unstable, an alloy made of Sn at a rate of 1 to 5% by weight, In at 3 to 10% by weight, one or two types of Fe, Ni and Co at 0.05 to 1% by weight and Ag for the remaining part is internally oxidized in Ag, and the Sn—In composite oxide of the added elements and oxides of one or two types of Fe, Ni and Co are uniformly and finely precipitated and dispersed in the internal structure.

Moreover, the present invention is characterized in that an oxide of In having a low steam pressure than CdO within a temperature range of approximately 500 to 4000° C. is dispersed in Sn and Bi oxides, thereby making the behavior of a synthetic steam pressure of these oxides in the form of a metal composite oxide more approximate to the behavior of the steam pressure of CdO so that their synergistic effect provides excellent contact properties. The present invention is also characterized in that as a measure for restraining generation of an Ag-rich layer on the outermost surface of the contact, which is considered to make the contact reliability of the contact unstable, an alloy made of Sn at a rate of 1 to 5% by weight, In at 3 to 10% by weight, Bi at 0.05 to 2% by weight, one or two types of Fe, Ni and Co at 0.05 to 1% by weight and Ag for the remaining part is internally oxidized, and the Sn—In composite oxide, In—Bi composite oxide, Sn—Bi composite oxide and Sn—In—Bi composite oxide of the added elements and oxides of one or two types of Fe, Ni and Co are uniformly and finely precipitated and dispersed in the internal structure.

Moreover, the present invention is characterized in that an oxide of In having a low steam pressure than CdO within a temperature range of approximately 500 to 4000° C. is dispersed in Sn and Sb oxides, thereby making the behavior of a synthetic steam pressure of these oxides in the form of a metal composite oxide more approximate to the behavior of the steam pressure of CdO so that their synergistic effect provides excellent contact properties. The present invention is also characterized in that as a measure for restraining generation of an Ag-rich layer on the outermost surface of the contact, which is considered to make the contact reliability of the contact unstable, an alloy made of Sn at a rate of 1 to 5% by weight, In at 3 to 10% by weight, Sb at 0.05 to 5% by weight, one or two types of Fe, Ni and Co at 0.05 to 1% by weight and Ag for the remaining part is internally oxidized, and the Sn—In composite oxide, In—Sb composite oxide, Sn—Sb composite oxide and Sn—In—Sb composite oxide of the added elements and oxides of one or two types of Fe, Ni and Co are uniformly and finely precipitated and dispersed in the internal structure.

Furthermore, the present invention is characterized in that an oxide of In having a lower steam pressure than CdO within a temperature range of approximately 500 to 4000° C. is dispersed in Sn, Bi and Sb oxides, thereby making the behavior of a synthetic steam pressure of these oxides in the form of a metal composite oxide more approximate to the behavior of the steam pressure of CdO so that their synergistic effect provides excellent contact properties. The present invention is also characterized in that as a measure for restraining generation of an Ag-rich layer on the outermost surface of the contact, which is considered to make the contact reliability of the contact unstable, an alloy made of Sn at a rate of 1 to 5% by weight, In at 3 to 10% by weight, Bi at 0.05 to 2% by weight, Sb at 0.05 to 5% by weight, one or two types of Fe, Ni and Co at 0.05 to 1% by weight and Ag for the remaining part is internally oxidized, and the Sn—In composite oxide, In—Bi composite oxide, Sn—Bi composite oxide, Sn—Sb composite oxide, In—Sb composite oxide and Sn—In—Bi—Sb composite oxide of the added elements and oxides of one or two types of Fe, Ni and Co are uniformly and finely precipitated and dispersed in the internal structure.

As described above, an alloy made by solving Sn, In and one or two types of Fe, Ni and Co, and if necessary, one type or more of Bi and Sb, into Ag, is prepared in a desired contact shape at a processing rate of 50 to 95%, and after replacement with pure oxygen under a normal pressure, the temperature is raised from 200° C. in an oxygen atmosphere with an oxygen pressure of 5 to 50 kg/cm$^2$ to set an internal oxidation temperature with an upper limit of 700° C. Thus, generation of an Ag-rich layer and an oxide-flocculated layer immediately below the Ag-rich layer, which are generated in the progress of internal oxidation of the conventional process, is restrained, and the internal dislocation density is increased by intense processing at the above-described high processing rate. By an interaction due to generation of many crystals and nucleuses for generating oxide particles, the composite oxides of the added elements are uniformly and finely precipitated and dispersed into the deep internal structure. This can provide a Cd-free electric contact having excellent electric properties such as deposition resistance, arc resistance and low contact resistance.

In the above description, the reason for setting the upper limit of the processing rate at 95% is that further processing is difficult in consideration of the limit of the processability of the material while processing at less than 50% is insufficient for generation of a sufficiently effective processing strain.

Moreover, the reason for the replacement with pure oxygen under a normal temperature and setting the oxygen pressure at 5 to 50 kg/cm$^2$ is that the replacement removes non-oxidative gases in the internal oxidation furnace, that is, nitrogen and hydrogen in the air, to improve the oxidation atmosphere in the furnace and that an oxygen pressure less than 5 kg/cm$^2$ is insufficient to realize uniform and fine precipitation and dispersion of the composite oxides of the added elements to the deep part in the material while an oxygen pressure equal to or higher than 50 kg/cm$^2$ increases the scale of the furnace facility and cannot provide an outstanding effect on the properties that matches the manufacturing cost.

Furthermore, the reason for raising the temperature from 200° in the pressured oxygen atmosphere and setting the internal oxidation temperature with the upper limit of 700° C. is that 200° C. is the lower limit of the temperature range of internal oxidation while at a temperature equal to or higher than 700° C., the diffusion rate of the solute element becomes higher than the diffusion rate of oxygen from the material surface in internal oxidation, thus forming solid layered flocculation on the surface layer of the structure and obstructing the subsequent progress of internal oxidation.

If the supply of pressured oxygen before the temperature rise is delayed, diffusion of the solute element starts in the state where diffusion of oxygen is insufficient, as in the above description, and the delay of supply of oxygen is considered to cause an oxide generation reaction on the surface layer of the structure and therefore deposition of an Ag-rich layer on the outermost surface.

Moreover, the reason for setting the upper limit of the content range of Sn with respect to Ag at 5% by weight is that addition exceeding this limit cannot realize fine precipitation of the oxide and forms solid layered flocculation inside the oxidized-structure, thus obstructing the subsequent progress of internal oxidation and causing serious fragility in the oxidized structure. On the other hand, addition less than 1% by weight cannot satisfy composite oxidation with many elements and cannot provide an addition effect for sufficient electric properties.

Next, the reason for setting the upper limit of the content range of In at 10% by weight is that addition exceeding this limit forms a fine oxide coating on the surface in combination with the other elements at the time of internal oxidation and makes entry of oxygen from the surface difficult. Addition less than 3% by weight cannot realize the restraining effect on volatile damage and exhaustion due to an arc, that is, the effect of the above-described lower steam pressure than that of CdO.

Moreover, the reason for setting the upper limit of the content range of Bi at 2% by weight is that addition exceeding this limit causes hot fragility and makes it difficult to prepare an alloy for making a finer oxide, which is an element of the present invention, at a processing rate of 50 to 95%. In addition, such addition causes significant flocculation of the oxide at the time of internal oxidation and obstructs the subsequent progress of internal oxidation. Addition less than 0.05% by weight does not realize the effect to finely disperse the composite oxide particles.

The reason for setting the upper limit of the content range of Sb at 5% by weight is that addition exceeding this limit forms a fine oxide coating on the surface in combination with the other elements at the time of internal oxidation and makes entry of oxygen from the surface difficult. Addition less than 0.05% by weight does not realize the contact surface cleaning effect, which is the effect of the higher steam pressure than that of CdO.

Furthermore, the addition of one or two types of Fe, Ni and Co is effective mainly for making finer crystal grains and equalizing the oxide particle size. The reason for setting the upper limit of this addition at 1% by weight is that alloying by a melting method is extremely difficult even when addition exceeding this limit is performed, whereas addition less than 0.05% by weight cannot realize the effect to make finer crystal grains and the like.

BRIEF DESCRIPTION OF THE DRAWINGS

FIG. 3 is a chart showing electric properties with respect to structure alloys in the conventional example and examples of the embodiment.

BEST MODE FOR CARRYING OUT THE INVENTION

To describe the present invention more in detail, examples of embodiment will be described with reference to the attached drawings.

Using Sn, In, Bi and Sb having purity of 99.5% by weight or higher and one or two types of Fe, Ni and Co as raw materials, composition alloys shown in FIG. 3 were prepared by the following process.

After an ingot melted and cast in a high-frequency induction melting furnace was hot-rolled, an Ag plate was bonded to one surface thereof by hot compression bonding to form an Ag layer for brazing.

Next, the material of each of examples 1 to 9 as shown in FIG. 3 was cold-rolled at each processing rate to form a plate with a thickness of 2 mm, and then a disc with a diameter of 6 mm was punched out.

In example 1, the temperature of this sample was raised to 200 to 600° C. in an oxidation atmosphere with an oxygen pressure of 50 kg/cm$^2$, thus internally oxidizing the sample.

In example 2, the temperature was raised to 200 to 630° C. in an oxidation atmosphere with an oxygen pressure of 30 kg/cm$^2$, thus internally oxidizing the sample.

In example 3, the temperature was raised to 200 to 550° C. in an oxidation atmosphere with an oxygen pressure of 5 kg/cm$^2$, thus internally oxidizing the sample.

In example 4, the temperature was raised to 200 to 700° C. in an oxidation atmosphere with an oxygen pressure of 50 kg/cm$^2$, thus internally oxidizing the sample.

In example 5, the temperature was raised to 200 to 670° C. in an oxidation atmosphere with an oxygen pressure of 5 kg/cm$^2$, thus internally oxidizing the sample.

In example 6, the temperature was raised to 200 to 650° C. in an oxidation atmosphere with an oxygen pressure of 20 kg/cm$^2$, thus internally oxidizing the sample.

In example 7, the temperature was raised to 200 to 600° C. in an oxidation atmosphere with an oxygen pressure of 10 kg/cm$^2$, thus internally oxidizing the sample.

In example 8, the temperature was raised to 200 to 680° C. in an oxidation atmosphere with an oxygen pressure of 8 kg/cm$^2$, thus internally oxidizing the sample.

In example 9, the temperature was raised to 200 to 450° C. in an oxidation atmosphere with an oxygen pressure of 40 kg/cm$^2$, thus internally oxidizing the sample.

For comparison, an alloy containing Ag and 12% by weight of Cd as conventional example 1, an alloy containing Ag, 6% by weight of Sn and 3% by weight of In as conventional example 2, and an alloy containing Ag and 7% by weight of In as conventional example 3 were prepared and formed in a similar shape at a processing rate of 50% or less, and then internally oxidized at a fixed temperature of 780° C. in an oxidation atmosphere with an oxygen pressure of 3 kg/cm$^2$. As a contact test, an actual machine test (AC 200V and 20 A) was carried out using a contact resistor, a deposition tester (rated at 60 A) and a commercially available contactor, and the electric properties were evaluated.

INDUSTRIAL APPLICABILITY

Figure 1:
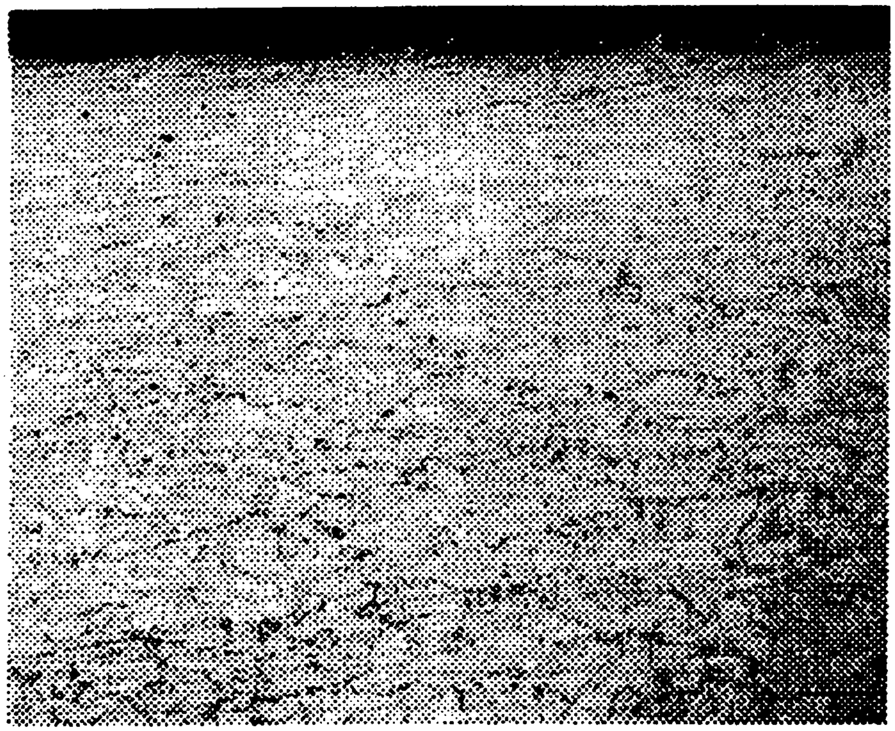
FIG. 1 is a micrograph showing an internal structure of example 4 of the embodiment.
Figure 2:
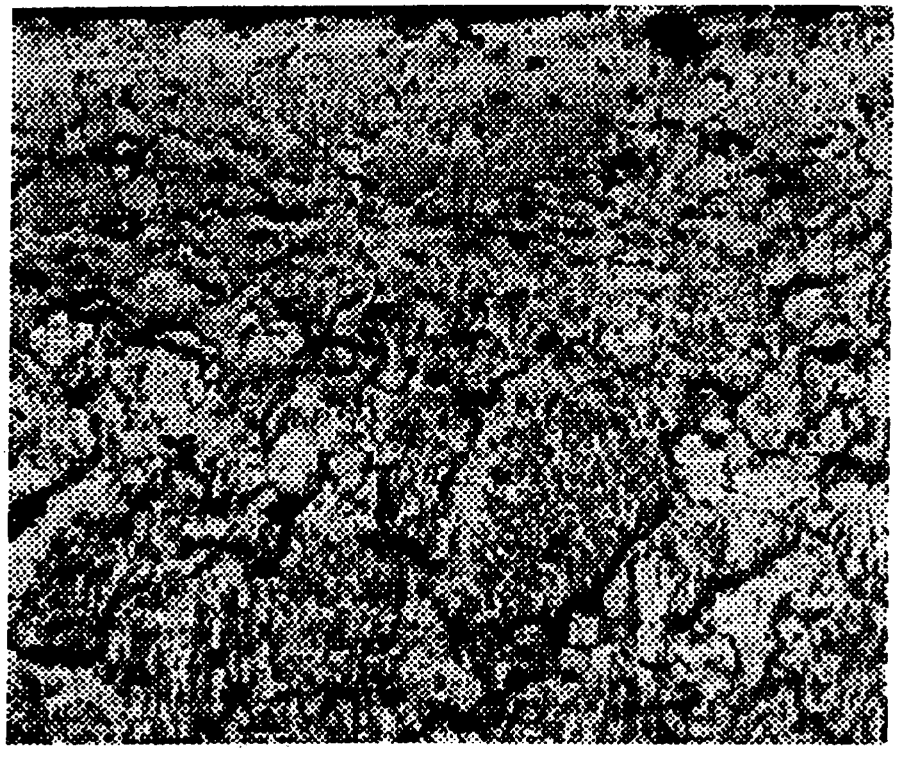
FIG. 2 is a micrograph showing an internal structure of conventional example 1.

According to the present invention described above in detail, excellent electric properties such as deposition resistance, arc resistance and low contact resistance are provided, and ideal effects are shown in view of oxide particles and crystal grain diameter, as seen in the oxide structure of example 4 shown in FIG. 1 and the oxide structure of conventional example 1 shown in FIG. 2.

Moreover, the present invention is effective for removing the Ag-rich layer appearing on the outermost surface.

The invention claimed is:

1. A method for manufacturing an internal-oxidation-type Ag-oxide-based electric contact material, characterized in that after an atmosphere in a pressured oxidation furnace is replaced with oxygen, the temperature of an internal-oxidative Ag alloy prepared under a condition of a cold roll rate of 50 to 95% is gradually raised from a temperature of 200° C. or less in a pressured oxygen atmosphere with an oxygen pressure of 5 to 50 kg/cm$^2$ and internal oxidation processing is performed with an upper limit temperature of 700° C., thereby restraining an Ag-rich layer generated on an outermost surface and an oxide-flocculated layer immediately below the Ag-rich layer and uniformly and finely precipitating and dispersing a composite oxide of added elements to a deep part of an internal structure.

2. The method for manufacturing an Ag-oxide-based electric contact material as claimed in claim 1, characterized in that the internal-oxidative Ag alloy prepared under the condition of a cold roll rate of 50 to 95% is an Ag alloy made of Sn, In, one or more types of Fe, Ni or Co, and Ag.

3. The method for manufacturing an Ag-oxide-based electric contact material as claimed in claim 1, characterized in that the internal-oxidative Ag alloy prepared under the condition of a cold roll rate of 50 to 95% is an Ag alloy made of Sn, In, one or more types of Bi and Sb, one or more types of Fe, Ni and Co, and Ag.

4. An Ag-oxide-based electric contact material made of Sn at a rate of 1 to 5% by weight, In at 3 to 10% by weight, one or more types of Fe, Ni and Co at 0.05 to 1% by weight, and Ag for the remaining part, by the manufacturing method of claims 1 or 2.

5. An Ag-oxide-based electric contact material made of Sn at a rate of 1 to 5% by weight, In at 3 to 10% by weight, Bi at 0.05 to 2% by weight, one or more types of Fe, Ni and Co at 0.05 to 1% by weight, and Ag for the remaining part, by the manufacturing method of claims 1 or 3.

6. An Ag-oxide-based electric contact material made of Sn at a rate of 1 to 5% by weight, In at 3 to 10% by weight, Sb at 0.05 to 5% by weight, one or more types of Fe, Ni and Co at 0.05 to 1% by weight, and Ag for the remaining part, by the manufacturing method of claims 1 or 3.

7. An Ag-oxide-based electric contact material made of Sn at a rate of 1 to 5% by weight, In at 3 to 10% by weight, Bi at 0.05 to 2% by weight, Sb at 0.05 to 5% by weight, one or more types of Fe, Ni and Co at 0.05 to 1% by weight, and Ag for the remaining part, by the manufacturing method of claims 1 or 3.

* * * * *

UNITED STATES PATENT AND TRADEMARK OFFICE

CERTIFICATE OF CORRECTION

PATENT NO. : 7,189,656 B2
APPLICATION NO. : 10/503300
DATED : March 13, 2007
INVENTOR(S) : Sadan Sato et al.

It is certified that error appears in the above-identified patent and that said Letters Patent is hereby corrected as shown below:

On the title page, item [73] Assignee, add -- Fuji Electric FA Components and Systems CO., LTD--.

Signed and Sealed this

Fourteenth Day of October, 2008

JON W. DUDAS
*Director of the United States Patent and Trademark Office*